United States Patent [19]

Widdowson

[11] Patent Number: 4,488,111

[45] Date of Patent: Dec. 11, 1984

[54] COUPLING DEVICES FOR OPERATIONS SUCH AS TESTING

[75] Inventor: Arnold B. Widdowson, Reading, Pa.

[73] Assignee: AT&T Technologies, Inc., New York, N.Y.

[21] Appl. No.: 383,875

[22] Filed: Jun. 1, 1982

[51] Int. Cl.³ .............................................. G01R 1/06
[52] U.S. Cl. .............................. 324/158 F; 324/158 P
[58] Field of Search ............... 324/158 P, 158 F, 72.5, 324/73 PC; 339/108 TP, 17 CF, 17 LM, 75 R, 75 M, 174

[56] References Cited

U.S. PATENT DOCUMENTS

| | | | |
|---|---|---|---|
| 3,835,381 | 9/1974 | Garretson et al. | 324/158 P |
| 3,866,119 | 2/1975 | Ardezzone et al. | 324/158 F |
| 3,963,986 | 6/1976 | Morton et al. | 324/158 F |
| 4,084,869 | 4/1978 | Yen | 339/17 CF |
| 4,094,568 | 6/1978 | Lee et al. | 339/17 LM |

OTHER PUBLICATIONS

"Probe Card Model P70-I" Probe-Rite, Incorporated 3/1974.
Renz, U. "Test Probe Contact Grid Translator Board" *IBM Tech. Disc. Bulletin*, vol. 21, No. 8 Jan. 1979 pp. 3235-3236.
Byrnes, H. P. "Test Contactor" *IBM Tech. Disc. Bulletin*, vol. 18, No. 10, Mar. 1976, p. 3233.

*Primary Examiner*—Stewart J. Levy
*Attorney, Agent, or Firm*—D. C. Watson

[57] ABSTRACT

A ring connector (80) is provided for electrically coupling device contacts such as probes (59) on a card (50) to circuit elements such as pads (94) on a performance board (90). The probes (59) are conventionally disposed outwardly of and around an axis 55 normal to card (50) whereat a device (10) being contacted is generally located. The ring connector (80) has first and second major faces, a thickness therebetween sufficient to install preferably insertable type couplers for coupling to contacts and circuit elements and an axis therethrough common to the axis 55 of the probe 59. Couplers such as sockets (84) are installed in the first face of the ring connector (80) for coupling to the probes (59) on card (50) and such sockets (84) are disposed outwardly of and around the common axis (55). Couplers such as pins (82) are installed in the second face of the ring connector (80) for coupling to circuit elements such as the pads (94) on the performance board (90). At least a first array of such pins (82) are advantageously disposed inwardly of the probe coupling sockets (84) and around the common axis (55). To acquire at least up to 140 conductive paths with a ring connector (80), a second array of couplers such as pins (82) are disposed outwardly of the probe coupling sockets (84) and around the common axis (55).

8 Claims, 6 Drawing Figures

COUPLING DEVICES FOR OPERATIONS SUCH AS TESTING

TECHNICAL FIELD

This invention relates to the coupling of devices such as miniature electrical or electronic devices for operations such as testing. More particularly, the invention relates to providing a plurality of electrical paths from densely disposed terminals on miniature devices to less densely disposed elements on circuit boards for analyzing the devices.

BACKGROUND OF THE INVENTION

Testing the electrical characteristics of miniature devices, e.g., discrete semiconductor devices and integrated circuits, either alone or in combination, is a major undertaking in modern industry. It is common practice to test such devices several times during their manufacture and at least once after final assembly in a device package. To be competitive such testing should be done at a high rate of throughput and with acceptable reliability.

As the semiconductor art has progressed, the operating advantages of having components close together and the cost savings associated therewith have led to higher densities of components in a device. Such intense miniaturization results in smaller device terminals such as metallized pads being disposed very closely together. For example, a silicon chip may now have more than 70 pads, which may be about 0.002 inch wide with as little as about 0.001 inch between such pads. It will be appreciated that electrically contacting all such pads simultaneously and performing a series of tests successively through the contacts is a challenging task.

In addition to the miniaturization problem, the testing programs have become more complex and sophisticated. Previously, integrated circuit devices (ICs) may have had up to about 120 tests performed upon them, mostly with analog signals. Today, it is not unusual for a particular IC to further have more than 200 digital tests also performed upon it. Moreover, such testing may be done in from about 100 milliseconds to about one minute for each device. To execute such programs, the testing equipment has also become increasingly complex and more sophisticated.

For example, a modern test station may include an analog testing module in conjunction with a digital computer to perform a series of tests under A.C. or D.C. conditions. Because the computer is readily programmable, the test station may be readily adapted to new devices. However, such changes alone are often too generalized to suit a particular family of devices. Therefore, there is interposed between the test station and a device, a circuit board having passive and active elements thereon and usually including a number of relays for multiplexing between various parts of a device circuit or between parts of the test station. Such circuit board is referred to in the art as a performance board. The performance board and a paper tape containing specific machine programming may accompany the introduction of a family of devices from a design laboratory to a manufacturing line.

The number of electrical paths from a test station to a performance board is generally high and depends upon the type and number of tests desired for a family of devices. However, the number of electrical paths from a performance board to a device usually depends upon the number of terminals on the device itself. The impedance characteristics of such paths are of serious consequence to test results, particularly when making time measurements. Consequently, an effort is made to have the paths as short and uniformly spaced as is reasonably practicable.

One popular way of keeping such paths short and uniform is to utilize a probe card having a central axis projecting perpendicularly therefrom. A device to be tested is located near such axis, and probes and metal paths radiate therefrom to a circular array of contacts. A probe card is typically selected to suit the size of a device to be tested and the number and location of its circuit terminals. There are typically a large number of probe cards associated with a family of devices to be tested and such cards may often be changed because of wear, obsolescence or subtle changes in testing technique.

Between a probe card and a performance board there is generally provided a coupler adapter which accepts probe cards on a plug-in basis. The adapter is often connected to the performance board on a substantially permanent basis and provides electrical paths appropriate to the device and the capability of the performance board. Heretofore, most testing has required up to about 70 paths which could advantageously be accommodated by a coupler board in the shape of a ring having 70 pins which plug into and are soldered to a performance board. Such ring adapter provides rapid and inexpensive installation and electrical paths which are short and uniform in length and spacing. However, for more than 70 paths most conventional adapters are provided in the form of a circuit board wherein metal paths are provided from a circular array of sockets to accept the probe card to linear arrays of terminals for connection to a performance board. Consequently, the paths are generally nonuniform in length and spacing and connections to a performance board are expensive and wasteful of space thereon.

It is desirable to provide new and improved adapters to couple contacts on a card to elements on a circuit board. It is also desirable to provide adapters having electrical paths which are short and uniform in length and spacing. Such adapters should be readily coupled to a performance board with a minimum of expense and loss of space thereon. To the extent feasible, it is advantageous that the adapters take the shape of a ring having circular arrays of couplers such as sockets which coincide with arrays of contacts found on prior art probe cards.

SUMMARY OF THE INVENTION

In accordance with the instant invention, apparatus is provided for coupling device contacts such as probes on a card to elements on a circuit board, e.g., a performance board, for testing miniature electrical devices. The device probes are typically disposed outwardly of and around an axis normal to the card whereat a device being probed is generally located. A coupler board is included having first and second major faces, a thickness therebetween to install preferably insertable type pins and sockets for coupling to probes and circuit elements and an axis therethrough common to the axis of the probes. Couplers such as sockets are installed in the first face for coupling to the probes and are disposed outwardly of and around the common axis. Couplers such as pins are installed in the second face for coupling to the circuit elements, at least a first array of such pins being advantageously disposed inwardly of the probe coupling sockets and around the common axis. Respective ones of the circuit coupling pins are electrically connected, such as by metallized paths in the coupler board, to respective ones of the probe coupling sockets.

BRIEF DESCRIPTION OF THE DRAWING

The invention will be more readily understood from the following detailed description when read in conjunction with the accompanying drawing, wherein.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

The Devices

Figure 4:
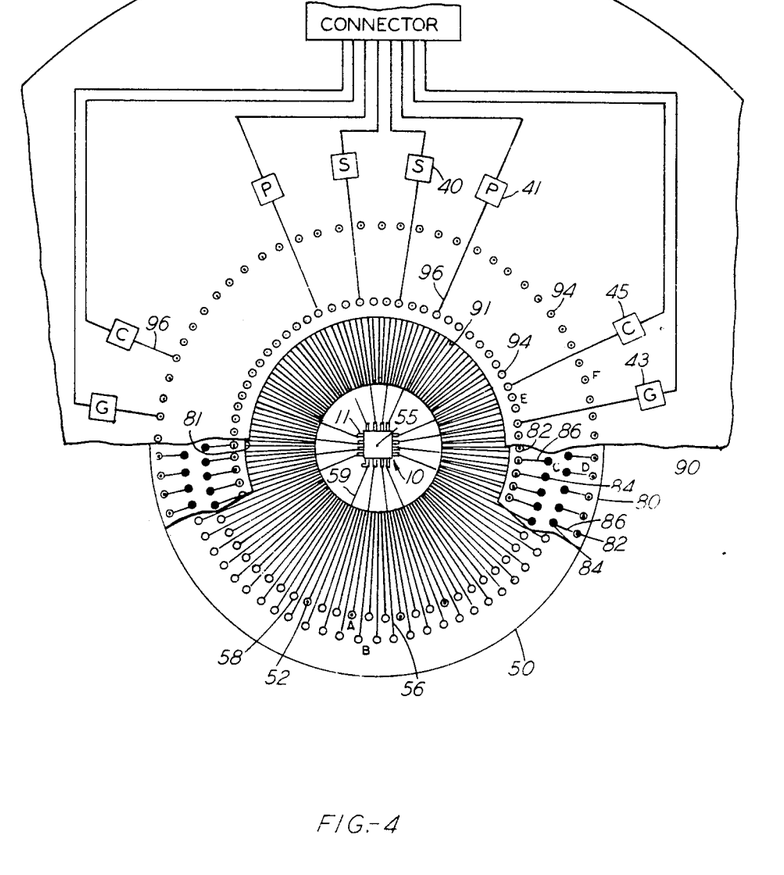
FIG. 4 is a similar view to that of FIG. 3 wherein a ring connector is shown according to the instant invention for coupling up to 140 probes to a performance board.
Figure 5:
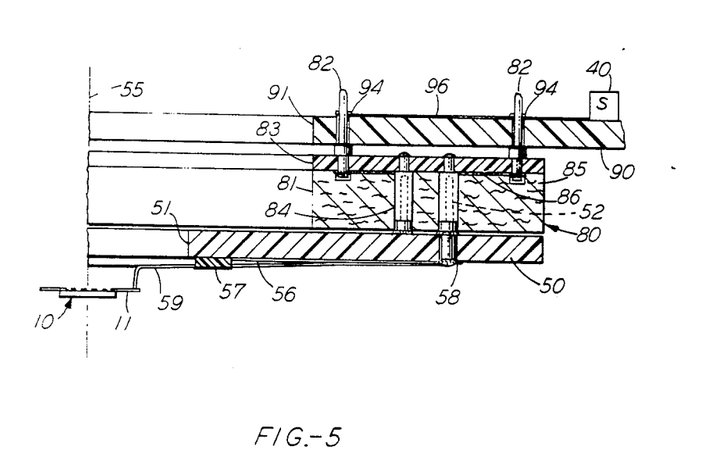
FIG. 5 is a sectional view of the ring connector shown in FIG. 4.

FIGS. 4–5 each show at least one device 10 which is coupled for operations such as testing in the practice of the invention. For purposes of illustration and discussion, such a device 10 will also often be referred to herein as an integrated circuit (IC) chip 10 or merely an IC 10. It is believed that practitioners in the art would characterize IC 10 as an electrical device which is electronic and a miniaturized semiconductor device having multiple components. On the other hand, it will be apparent from the discussion which follows, that the invention is not so limited. It is believed that the invention is reasonably applicable to a broad range of devices which operate over conductive paths wherein such paths are coupled in a releasable or fixed manner from a device to equipment for operating the device.

Device 10 is depicted as an IC chip having beam leads although the chip could be packaged in a carrier or mounted to a substrate having pad terminals. Similarly, device 10 could be a discrete device such as, for example a planar transistor, or a hybrid device which may include discrete, IC, and thin film components in or out of a package. The invention is similarly applicable to coupling other packaged devices having insertion type leads such as, for example, those in dual in-line packages (DIPs).

It will be apparent that the invention is amenable to coupling devices for operation according to the given purpose of the device rather than merely for testing. Therefore, coupling via an adapter to contacts on a card may be on a permanent basis and the contacts may be in the form of permanent leads fixedly secured to a device 10. However, it is presently preferred to describe the invention with respect to coupling on a probe contact basis for testing purposes because of the challenges associated therewith.

Testing Equipment

Figure 1:
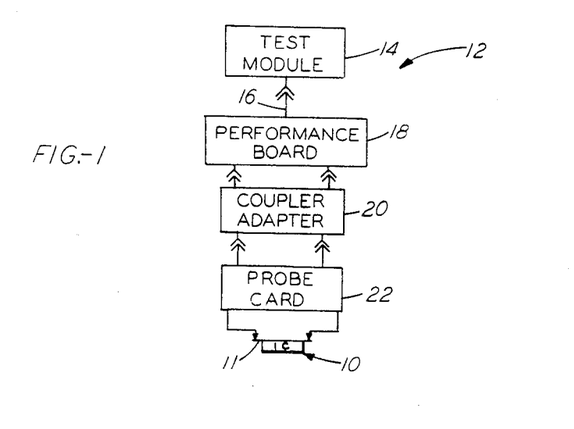
FIG. 1 is a simplified diagram of a typical station for testing miniature electrical devices.

FIG. 1 illustrates schematically a simple arrangement of equipment for testing devices such as ICs 10 having terminals 11. A test station 12 includes a test module 14 coupled to a performance board 18. The test module 14 may include a variety of analog test sections, selective power supplies, a switching time module, connections to a computer which may be time shared and various special test sections. Module 14 may perform somewhat general categories of analog and/or digital tests which may include time measurement on a family of devices 10.

Test module 14 may be releasably connected to performance board 18 by a single bundle 16 of leads although the analog sections, the computer and the switching time module may be separately connected to board 18 and/or to each other. Test module 14 may operate device 10 in its functional mode using a group of leads equal in number to the terminals on the device. Additionally, there are many tests involving only a part of device 10 or only a component thereon. There are further tests which may require about 5–10 leads from module 14 to a particular terminal or a set of terminals on a device 10. Consequently, there may be up to about 150 leads in bundle 16 whereas the number of conductive paths needed from board 18 to device 10 generally corresponds to the number of terminals 11 on the device 10. Accordingly, relays on board 18 may perform multiplexing functions and further circuitry thereon may include passive and active elements to tailor tests to a specific, quite small group of devices 10.

Board 18 is preferably located close to a mechanism (not shown) for probing a device 10. Devices are indexed to and from a test position at the probing mechanism where they are typically viewed under magnifying apparatus because of the typically miniature scale of device features. The probing mechanism generally includes micropositioning tools to move a device in X, Y and Z directions as required to make contact with all terminals 11.

In an advantageous method of testing devices 10, the performance board 18 is mounted directly to the probing mechanism. Typically, there is a coupler adapter 20 mounted to performance board 18 and a probe card 22 mounted to adapter 20.

Figure 2:
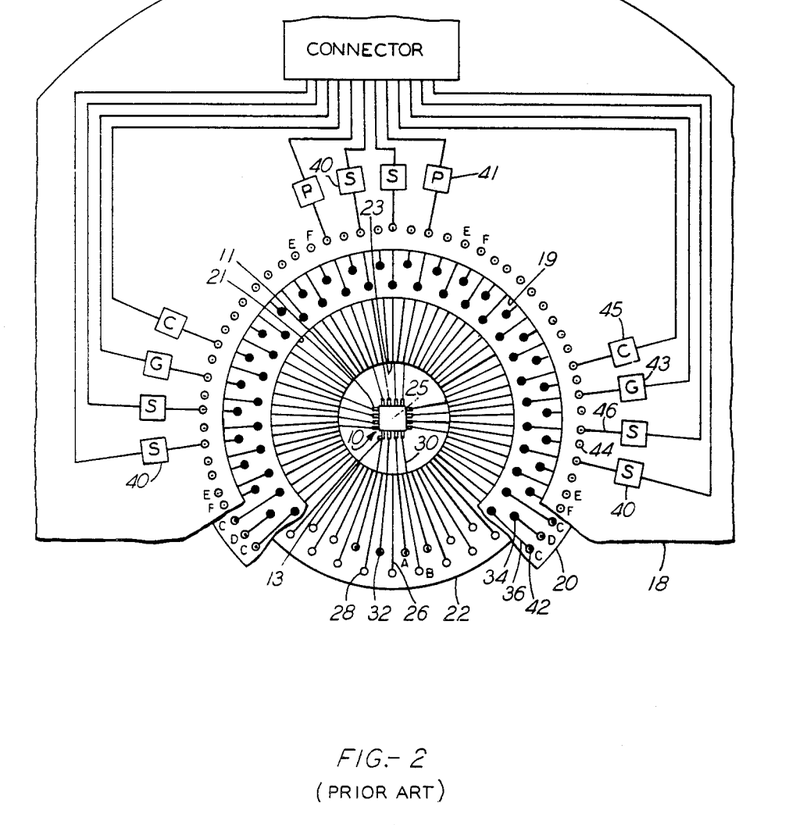
FIG. 2 is a partial plan view of a performance board coupled to a prior art ring connector, a probe card and a device being probed.

FIG. 2 illustrates some of the testing equipment according to the advantageous method referred to and particularly portions of the board 18, adapter 20 and card 22 which are enlarged about 1½ times for clarity and portions are cut away to show detail. Items 18, 20 and 22 may have openings 19, 21 and 23, respectively, surrounding a generally central theoretical axis 25 which projects normally from card 22. Usually, a device 10 under test is located at axis 25 and the openings 19, 21 and 23 permit access to and viewing of device 10 from above performance board 18.

One of the most significant advantages of an integrated circuit method of providing electronic components lies in the speed with which the components interact with each other. Therefore, time measurements such as those involving signal propagation, switching time and delay time are significant in the art of testing devices such as ICs 10. Such measurements are enhanced when the electrical paths from a performance board are uniform in impedance. Since at least such factors as length, section and spacing of metal conductors bear upon impedance, the paths should be uniformly short, wide and thick and equally spaced. It will be apparent that coupling the board 18, adapter 20 and card 22 to a device about a common axis offers a convenient method of providing electrical paths having the desired characteristics.

For simplicity, device 10 is depicted in the drawing as an IC chip 10 which is about 0.200 inch square and has sixteen beam type terminals. A terminal 13 is included having a flag configuration which facilitates orienting device 10 with respect to the features shown on card 22. It will be seen that card 22 has seventy conductive paths which could accommodate a device 10 having up to about seventy terminals 11. On the underside face of card 22, such paths are provided in the form of metallized lands 26. Consequently, to facilitate description the card 22 is assumed to be of a transparent plastic such as plexiglas or polycarbonate so the lands 26 are seen in the drawing.

To couple a device 10 to a performance board 18 with uniformly constructed, short paths, the layout of lands 26 offers significant advantages well known in the prior art. For example, it can be seen that the lands 26 radiate like spokes on a wheel from near the central axis 25 whereat a device 10 is generally located. Moreover, as lands 26 extend outwardly, the spacing between adjacent lands becomes more extensive. Consequently, it is common practice to provide circular arrays of coupling features such as metallized via holes referred to herein as grommets 28 on card 22 at the outward ends of lands 26. In a dense array of lands 26 around axis 25, it is sometimes necessary to extend lands 26 outwardly a considerable distance in order to gain space between lands for grommets 28. Often it is desirable to provide concentric circles of grommets 28 as shown in FIG. 2. Notice that grommets 28 do not always appear immediately next to one another along a circular arc. Instead, the grommets 28 and lands 26 sometimes appear alternately along the arc to preserve space which is almost always at a premium on probe cards, adapters and performance boards.

From the grommets 28 and/or from the lands 26, wires 30 are installed as shown in FIG. 2 to contact the terminals of device 10. Such wires 30 are normally fixedly connected to selected grommets 28 or lands 26 or both. The wires 30 also may be fixedly connected to the terminals 11 although for testing it is more likely that they will releasably contact such terminals such as by probing a terminal surface. One of the purposes of the invention is to electrically couple the densely disposed terminals of device 10 to less densely disposed elements on performance board 18. The lands 26, the grommets 28 and couplers thereto such as pins, probes, wires or leads facilitate the invention purpose. Consequently, such items will be referred to collectively herein as device contacts since such items facilitate coupling device 10 to a performance board 18.

Separate probe cards such as card 22 may be provided for a single device 10 to run groups of tests during or after the device is completed. For example, a probe card may probe portions of an IC 10 during its processing in a wafer, another card may be used when it is separated from the wafer and separate cards may later be utilized for front and back probing of the IC chip 10.

Therefore, it is desirable to readily couple card 22 to adapter 20 such as by plugging pins on the card into sockets on the adapter 20. Consequently, a pin 32 is generally installed in each grommet 28 which in some manner makes contact to a terminal 11 or 13. It will be incidentally seen in FIG. 2 that the grommets 28 on card 22 are installed along diameters having concentric circles which are an informally accepted standard for many manufacturers of probe cards having seventy contacts.

It is evident that tracing a conductive path from a wire 30 at a terminal 11 to an appropriate element on a performance board can be tedious. Accordingly, those in the art normally assign a number (not shown) to each grommet 28 on card 22 so each conductive path may be identified with respect thereto. The particular card 22 shown in FIG. 2 has an inner circle of grommets 28 labelled an "A" ring and an outer circle of grommets labelled a "B" ring. For purposes of following conductive paths in this description, the inner circle of grommets 28 which are noted with the letter "A" on card 22 will have subsequent items which are coupled thereto noted with the letter "C" on adapter 20 and with the letter "E" on board 22. In like manner, the outer circle of grommets 28 which are noted with the letter "B" on card 22 will have subsequent items which are coupled thereto noted with the letter "D" on adapter 20 and with the letter "F" on board 18.

Ring Adapters

FIG. 2 further shows a prior art method of coupling probe card 22 to performance board 18 utilizing a conventional ring type adapter 20. Adapter 20 has a thickness which is suitable for accommodating sockets 34 therein for coupling to pins 32 on card 22. Of course, such sockets 34 appear along circular arcs having diameters which are the given standard for probe cards such as card 22. From sockets 34, as they protrude through the top face of adapter 20, conductive lands 36 extend radially outward according to the layout considerations discussed with respect to lands 26 on card 22. The lands 36 extend for a distance outwardly sufficient to develop enough space between adjacent lands to install pins 42 for coupling to board 18.

In this case a quite small radial distance is sufficient to gain enough space between lands 36 to install all seventy pins 42 in one circular row of pins 42. Such pins 42 advantageously plug into apertures which are installed in a circular row and protrude through metallized pads 44 on the top of performance board 18.

From elements such as pads 44 on the board 18, circuit elements such as lands 46 may be provided also radiating outwardly to other circuit elements or, in place of lands 46, wire conductors may be directly connected to the ends of pins 42 or to the pads 44. On a given board 18 pins 42 or pads 44 may be connected for providing, inter alia, power, ground, signals or control to device 10. Paths for signals, especially input signals, are particularly sensitive to impedance problems. For illustrative purposes, some lands 46 are shown radiating outward to a roughly symmetrical placement of elements 40 around axis 25 for signals. Such elements 40 may include analog or digital buffers or circuit loading elements. Also certain lands 46 may connect to power elements 41 such as oscillators for low frequency A.C. power or items for steady state high or low power with or without relays. Paths also connect to ground elements 43, either at substantially earth type potential, common ground connections or especially filtered, noise reducing grounds for special purposes. There may further be connections to control elements 45 such as mechanical or electrical switches, relays and the like for control or monitoring purposes sometimes with pilot lights.

FIG. 2 shows, with respect to axis 25, that all conductive paths to performance board 18 are about as short as present technology permits. Also, the spacing between paths is substantially uniform and lands, pins, sockets and pads are of adequate size for acceptably low impedance in operating a device 10. Consequently, ring adapter 20 offers an excellent method at an acceptable cost for coupling a device 10 with up to seventy paths having the characteristics desired. Given the close layout shown in FIG. 2, it is not unusual to find that manufacturers of probe cards have adopted much larger circular arrays of contacts when providing more than seventy conductor paths.

Up to 140 Paths

Figure 3:
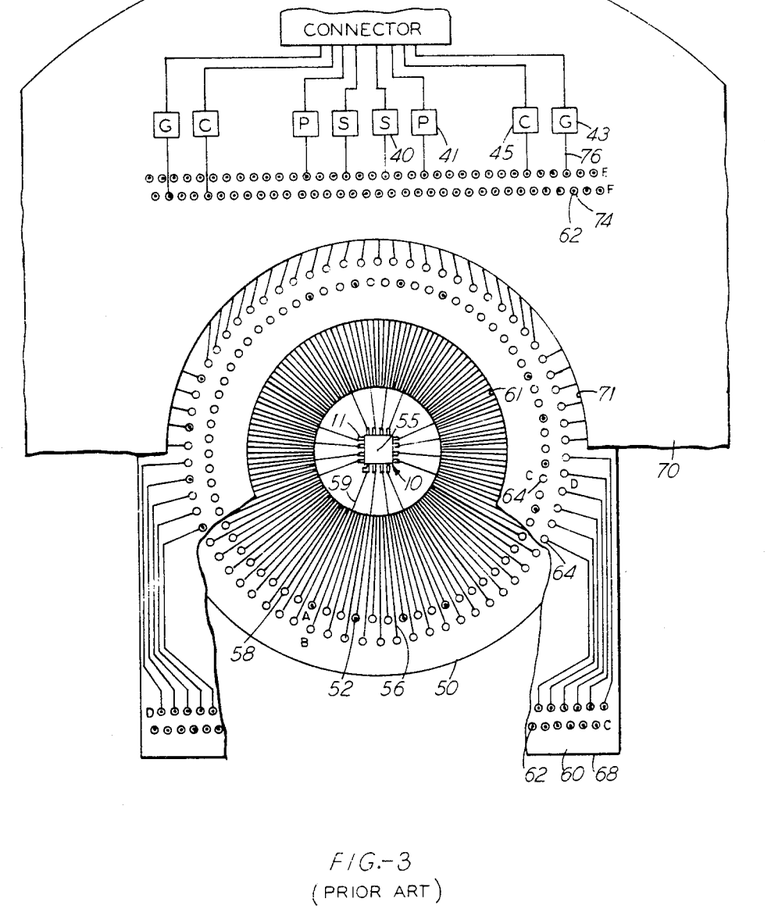
FIG. 3 is a similar view to that of FIG. 2 showing a prior art panel connector for coupling up to 140 probes to a performance board.

FIG. 3 illustrates, without intentional enlargement, a prior art method of coupling up to 140 device contacts for operating a device 10 such as for testing. A prior art probe card 50 has a central opening 51 (FIG. 5) and a theoretical axis 55 extending normal to card 50 whereat a device 10 is generally located for testing. For simplicity, device 10 is selected to be the same as, or similar to, the IC discussed previously. Card 50 is about four inches in diameter, about 0.13 inch thick and is made of a dielectric material which will also be assumed to be transparent so features on the underside face can be seen in FIG. 3.

There are 140 current paths provided on the underside face of card 50 in the form of metallized lands 56, each radiating like spokes on a wheel from near the central axis 55. As the lands 56 extend outwardly, spacing between adjacent lands becomes increasingly more extensive. To keep the layout confined a first row of metallized via holes in the form of grommets 58 are formed in a circle and are often labelled with even numbers 2-140 (not shown). Every other land 56 continues a short distance further ending in a second row of metallized via holes in the form of grommets 58 arranged in another circle and often labelled with odd numbers 1-139 (not shown). Such arrays of grommets 58 are subsumed herein under the category of device contacts provided along concentric circles having typical diameters of 2.88 and 3.25 inches, respectively, which are generally common in the art.

From the grommets 58 and/or from the lands 56, wires 59 are installed as shown to contact the terminals 11 and 13 of device 10. Each such path which is actually utilized for the device 10 under test has a pin 52 installed in a respective grommet 58. In this case an array of sixteen pins 52 are provided for coupling to an adapter shown in FIG. 3 and referred to therein as a coupler panel 60. Panel 60 has a central opening 61 and an array of sockets 64 installed on the underside face disposed along two concentric circles matching the concentric circles of grommets 58 in card 50. The top ends of sockets 54 protrude through panel 50 where they are typically anchored with solder and numbered to correspond with respective grommets in the probe card 50. For purposes of description, the inner and outer grommets 58 are also given the respective letters A and B on card 50 which are respectively coupled to items noted as C and D on panel 60 and E and F on a performance board 70, said board to be discussed hereinafter.

It will be appreciated that panel 60 could be constructed with lands from both C and D rows of sockets 64 radiating outward a sufficient distance to develop a sufficient arcuate length to establish one continuous circular row of 140 pins similar to that of the ring connector 20 shown in FIG. 2. However, the diameter of such a circle would be about 4.5 inches which means that a ring connector used in place of panel 60 would be about 5 inches in diameter. Also, every pin would have to be almost perfectly formed to facilitate insertion of 140 pins in a continuous circle into a performance board. Perhaps for these reasons, the industry has conventionally provided an adapter such as panel 60 wherein one-half of the paths are electrically continued on each side of the panel. Although FIG. 3 shows lands 66 extending from only the D circle of sockets 64, there are similar lands 66 extending on the underside face of panel 60 from the C circle.

Lands 66 extend to arrays of metallized via holes in the form of grommets 68 which are aligned in two rows along two edges of panel 60. From the resulting four linear arrays of grommets 68, connections are made to the performance board 70 which board has a central opening 71 and is otherwise quite similar to performance board 18 shown in FIG. 2. Such connections may be in the form of pins 62 in panel 60 which protrude through pads 74 in performance board 70. Also, the connections could be in the form of more permanent type wire stitching. From elements such as the pads 74, lands 76 are provided on board 70 to couple to other circuit elements such as elements 40, 41, 43 and 45 previously described with respect to FIG. 2.

It is apparent from FIG. 3 that the conductive paths provided by panel 60 are nonuniform in length and spacing. Also, the impedance expected along each respective path is varied. Additionally, it is evident that the arrays of pads 74 are neither circular nor symmetrical with respect to a typically circular type board such as performance board 70. Consequently, when testing ICs and especially when taking time measurements, significant adjustments are made to account for impedance differences. Perhaps because of these differences some practitioners have elected to mount a probe card 50 and an adapter such as panel 60 on a probing mechanism separately from a performance board 70. To this end, several designs of adapters are constructed with edge connectors for the conductive paths from which leads are coupled to such separate performance boards or to special, dedicated testing modules.

Up to 140 Paths on Ring Connectors

FIG. 4 discloses a method of coupling devices through up to 140 paths to a circuit board with a ring connector according to the instant invention. In FIG. 4, the device 10, probe card 50 and associated features are provided in the same manner as in the prior art shown in FIG. 3 for simplicity and clarity. A novel coupler adapter 80 has some features which are known in the prior art and other features which are believed to be contra-indicated by the prior art.

For example in FIG. 4, adapter 80 has exposed and hidden, substantially parallel major faces and a thickness therebetween sufficient to accommodate items for coupling to device contacts and circuit elements. Such items may preferably be insertable type couplers such as sockets to couple to probe card pins and similarly insertable type pins to couple to metallized pads on a performance board. Adapter 80 also has a central opening 81 for viewing and similar access to a device 10 being tested. Opening 81 and many features of adapter 80 are disposed around an axis 55 which is common to card 50 and its grommets 58.

Other features include two rows of sockets 84 which are shown along circles having the same diameters as circles for the grommets 58 provided in probe card 50 and the sockets 64 in panel 60 shown in FIG. 3. From the C row of sockets 84, and in a perceived departure from the prior art, lands 86 extend radially inward a distance which is just sufficient to install a first circular row of pins 82. Note by extending inwardly, there is slightly less distance along a circular arc for the installation of the first array of pins 82 than along a circular arc of sockets 84 from which the lands 86 are extended. However, the radial distance inwardly is only about 0.27 inch in the illustrative example and only one-half of the total array of sockets 84 need be connected. Consequently, by disposing the first array of pins 82 in a direction contrary to customary layout practice, distinct advantages are gained. For example, lands 86 may be wider than the space between adjacent sockets 84 normally permits.

The lands 86 from the D ring of sockets are extended radially outward as before ending in a second array of pins 82 for connection to a board 90. The C and the D row of pins 82 are then readily installed in coincident E and F rows of pads 94 provided in board 90 about a central opening 91. From elements such as pads 94, lands 96 may be extended to circuit elements 40, 41, 43 and 45 as shown in FIG. 2 and discussed previously.

It is evident from an examination of FIG. 4 that many advantages accrue from the instant invention. For example, 140 conductive paths are provided by a ring connector 80 which is only about 4 inches in diameter. The connector 80 is readily mounted with minimal expense to a performance board 90. Note that there is an inwardly disposed, even numbered group of conductive paths and an outwardly disposed, odd numbered group of conductive paths (numbers not shown). Within each group the length of paths are about as short and as uniformly spaced as present technology permits. Also, the differences in length of paths between the two groups are substantially uniform, quite small and easily ascertained. Moreover, the space between the E and F rows of pads 94 on board 90 is available for installing circuit elements if desired.

Probing a Device

FIG. 5 is a partial sectional view of the apparatus shown in FIG. 4 taken along a transverse center line through axis 55 which further shows the advantageous method of coupling a device 10 to a circuit board 90. Ring connector 80 is preferably constructed with a top plate 83 made of a strong dielectric material such as a glass filled epoxy. Appropriate pins 82 and appropriate sockets 84 may be installed as shown in plate 83 and fixedly attached thereto as shown. Between the sockets 84 and pins 82, metallized lands 86 provide electrical connection as shown. A dielectric fiber material is machined in the configuration shown to provide a member 85 which is sufficiently thick to accept appropriate portions of the pins 82 and sockets 84 and member 85 is attached to member 83 such as by an appropriate adhesive.

A probe card 50 has pins 52 installed in metallized via holes referred to as grommets 58. There is at least one pin 52 for each terminal 11 or 13 of device 10 to be contacted. Probe card 50 is mounted to adapter 80 by plugging all pins 52 into appropriate sockets 84. Similarly, but more permanently, adapter 80 is mounted to performance board 90 by plugging 140 pins 82 into 140 pads 94 in performance board 90. Metallized lands 96 on board 90 connect to circuit elements, for example, to element 40.

Probe card 50 further has a wire 59 fixedly attached to an appropriate grommet 58 and a land 56. Wire 59 may be biased away from card 50 by a ring 57 located adjacent central opening 51 whereat devices 10 are generally located. A device 10 is indexed into opening 51 and manipulated in X, Y and Z directions as required to orient the device and align all terminals 11 or 13 with downwardly bent probe portions of wires 59. Device 10 is elevated sufficiently to contact all wire probes 59 to respective terminals 11 or 13 and device 10 is electrically coupled for operations such as for testing.

Alternate Embodiments

Figure 6:
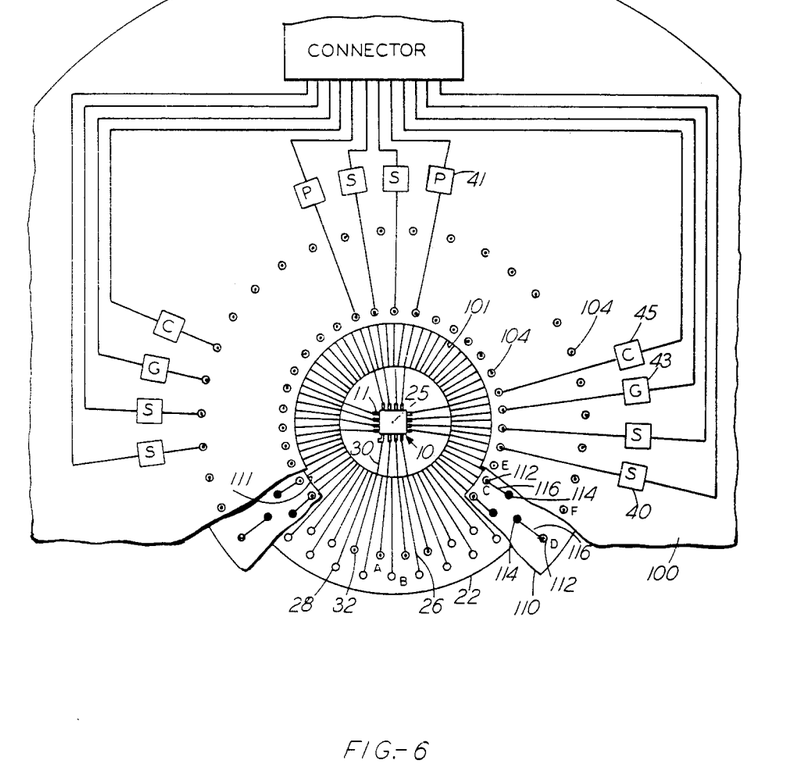
FIG. 6 is a similar view to that of FIG. 2 wherein a ring connector is shown according to the instant invention for coupling up to 70 probes to a performance board.

Reference is made to FIG. 6 wherein apparatus is shown similar to that of the prior art apparatus shown in FIG. 2 and wherein dissimilar apparatus has been highlighted by dissimilar numerical designations. It will be seen that the principles of the invention may be utilized to modify prior art adapters having 70 or less conductive paths for coupling devices 10.

The probe card 22 shown in FIG. 6 is the same as that shown in FIG. 2; however, a performance board 100 has an opening 101 which is smaller than opening 19 in board 18. By reference to FIG. 2, it can be seen that much of opening 19 is unnecessary for viewing a device 10 being probed because the opening 21 in ring connector 20 obscures much of card 22 and its features.

According to the teachings of the instant invention, couplers such as pins and/or sockets may be more spaciously arranged by providing at least a first array of inwardly extending lands and couplers on an adapter. Accordingly a prior art adapter is made wider as shown in FIG. 6 by slightly closing opening 21 about 0.250 inch annularly. A new adapter 110 is shown having an opening 111 which opening is about the same size as opening 101 in board 100. Also, lands 116 are extended inwardly a short distance from a C row of sockets 114 and pins 112 are disposed along a circle as shown. Such pins 112 in a C row and another circle of pins 112 installed in a D row protrude through pads 104 on board 100 to become rows E and F. Note that, by such practice of the invention, the E and F circuit elements are less congested and there is more usable space on the performance board 100 than on the performance board 18 known in the prior art. Yet an operator has lost very little visibility of the device 10 and its probe wires 30. Moreover, lands 116 on adapter 110 may be wider and the placement of pins 112 and sockets 114 may be less precise than similar items in the prior art ring connector 20 shown in FIG. 2.

There have been illustrated herein certain embodiments of the invention and certain applications thereof. Nevertheless, it is to be understood that various modifications and refinements may be made and used which differ from these disclosed embodiments without departing from the spirit and scope of the present invention.

For example, it has been seen that up to 140 paths are provided in a new ring connector 80, shown in FIG. 4. Yet, it will be appreciated that the quantity of 140 paths was chosen only to show contrast with prior art apparatus such as panel 60, shown in FIG. 3. It is well within the spirit and scope of the invention to apply its teachings to other ring connectors, e.g., those having different quantities of electrical paths which may couple devices through contacts disposed along the same or different arrays around a common axis.

What is claimed is:

1. Apparatus for electrically coupling device contacts on a card to circuit elements on a circuit board, said device contacts being disposed outwardly from and in at least one circular array around an axis perpendicular to a plane parallel to the card whereat a device being contacted is generally located, comprising:

a coupler board having first and second major faces, a thickness therebetween to accommodate means for coupling to the device contacts and circuit elements and having an axis extending through the board and perpendicular to at least one of the major faces, said axis being common to the axis of the contacts on the card;

means in the first major face for coupling to said contacts on the card, such means being disposed outwardly from and in at least one circular array around the common axis;

means in the second major face for coupling to said circuit elements, at least a first circular array of such means being disposed inwardly from the most inwardly disposed contact coupling means and around the common axis; and means for electrically connecting respective ones of said circuit element coupling means to respective ones of said contact coupling means.

2. Apparatus as in claim 1, wherein the means in the second major face for coupling to said circuit elements, further comprises:

a second circular array of such means disposed outwardly from the contact coupling means and around the common axis.

3. Apparatus as in claim 2, wherein the means for coupling to said contacts comprises:

a circular array of sockets installed substantially within the first face of the coupler board; and at least the first means for coupling to said circuit elements comprises:

a circular array of pins installed on the second face.

4. Apparatus as in claim 3, wherein the coupler board is of a doughnut configuration having a circular periphery concentric with a circular opening around the common axis for viewing the device being probed.

5. A method of electrically coupling device contacts on a card to circuit elements on a circuit board, said device contacts being disposed outwardly from and in at least one circular array around an axis perpendicular to a plane parallel to the card whereat a device being contacted is generally located, comprising:

disposing between the card and the circuit board, a coupler board having first and second major faces, a thickness therebetween to accommodate means for coupling to the device contacts and circuit elements, and having an axis extending through the board and perpendicular to at least one of the major faces, said axis being common to the axis of the contacts on the card;

coupling said contacts on said card to means provided in the first major face of the coupler board, said means being disposed outwardly from and in at least one circular array around the common axis;

coupling said circuit elements on the circuit board to means provided in the second major face of the coupler board, at least a first circular array of such means being disposed inwardly from the most inwardly disposed contact coupling means and around the common axis; and electrically connecting respective ones of said circuit element coupling means to respective ones of said contact coupling means.

6. A method as in claim 5, wherein the step of coupling the circuit elements on the circuit board to means provided in the second major face of the coupler board, further comprises:

coupling circuit elements to a second circular array of means in the second major face of the coupler board disposed outwardly from the contact coupling means and around the common axis.

7. A method as in claim 6, wherein the step of coupling the contacts on the card to means provided in the first face of the coupler board further comprises:

coupling the contacts on the card to a circular array of sockets installed substantially within the first face of the coupler board; and wherein the step of coupling circuit elements on the circuit board to at least a first array of means in the coupler board further comprises:

coupling circuit elements on the circuit board to a circular array of pins installed on the second face of the coupler board.

8. A method as in claim 7, wherein the coupler board disposed between the card and the circuit board is of a doughnut configuration having a circular periphery concentric with a circular opening around the common axis for viewing the device being probed.

* * * * *